United States Patent [19]
Merrill et al.

[11] Patent Number: 6,150,683
[45] Date of Patent: Nov. 21, 2000

[54] CMOS-BASED COLOR PIXEL WITH REDUCED NOISE IN THE BLUE SIGNAL

[75] Inventors: Richard Billings Merrill, Woodside; Kevin Brehmer, San Jose, both of Calif.

[73] Assignee: Foveon, Inc.

[21] Appl. No.: 08/883,677

[22] Filed: Jun. 27, 1997

[51] Int. Cl.$^7$ .................. H01L 31/062; H01L 31/113

[52] U.S. Cl. .................. 257/292; 257/294; 257/440; 257/463; 438/70; 438/80

[58] Field of Search .................. 257/291, 292, 257/294, 432, 440, 443, 463; 438/70, 80

[56] References Cited

U.S. PATENT DOCUMENTS

| | | | |
|---|---|---|---|
| 5,625,210 | 4/1997 | Lee et al. | 257/292 |
| 5,965,875 | 10/1999 | Merrill | 250/226 |
| 5,969,337 | 10/1999 | Yiannoulos | 250/214.1 |
| 6,021,172 | 2/2000 | Fossum et al. | 377/60 |

*Primary Examiner*—Ngân V. Ngô
*Attorney, Agent, or Firm*—Limbach & Limbach L.L.P.

[57] ABSTRACT

The blue signal of a CMOS-based color pixel is increased with respect to the red and green signals by lowering the doping concentration of the surface regions of the pn-junction photodiodes that are used in the blue imaging cells with respect to the surface regions of the pn-junction photodiodes that are used in the red and green imaging cells.

20 Claims, 7 Drawing Sheets

CMOS-BASED COLOR PIXEL WITH REDUCED NOISE IN THE BLUE SIGNAL

BACKGROUND OF THE INVENTION

1. Field of the Invention

The present invention relates to CMOS-based color pixels and, more particularly, to a CMOS-based color pixel with reduced noise in the blue signal.

2. Description of the Related Art

Charge-coupled devices (CCDs) have been the mainstay of conventional imaging circuits for converting a pixel of light energy into an electrical signal that represents the intensity of the light energy. In general, CCDs utilize a photogate to convert the light energy into an electrical charge, and a series of electrodes to transfer the charge collected at the photogate to an output sense node.

Although CCDs have many strengths, which include a high sensitivity and fill-factor, CCDs also suffer from a number of weaknesses. Most notable among these weaknesses, which include limited readout rates and dynamic range limitations, is the difficulty in integrating CCDs with CMOS-based microprocessors.

To overcome the limitations of CCD-based imaging circuits, more recent imaging circuits use active pixel sensor cells to convert a pixel of light energy into an electrical signal. With active pixel sensor cells, a conventional photodiode is combined with a number of active transistors which, in addition to forming an electrical signal, provide amplification, readout control, and reset control.

Figure 1:
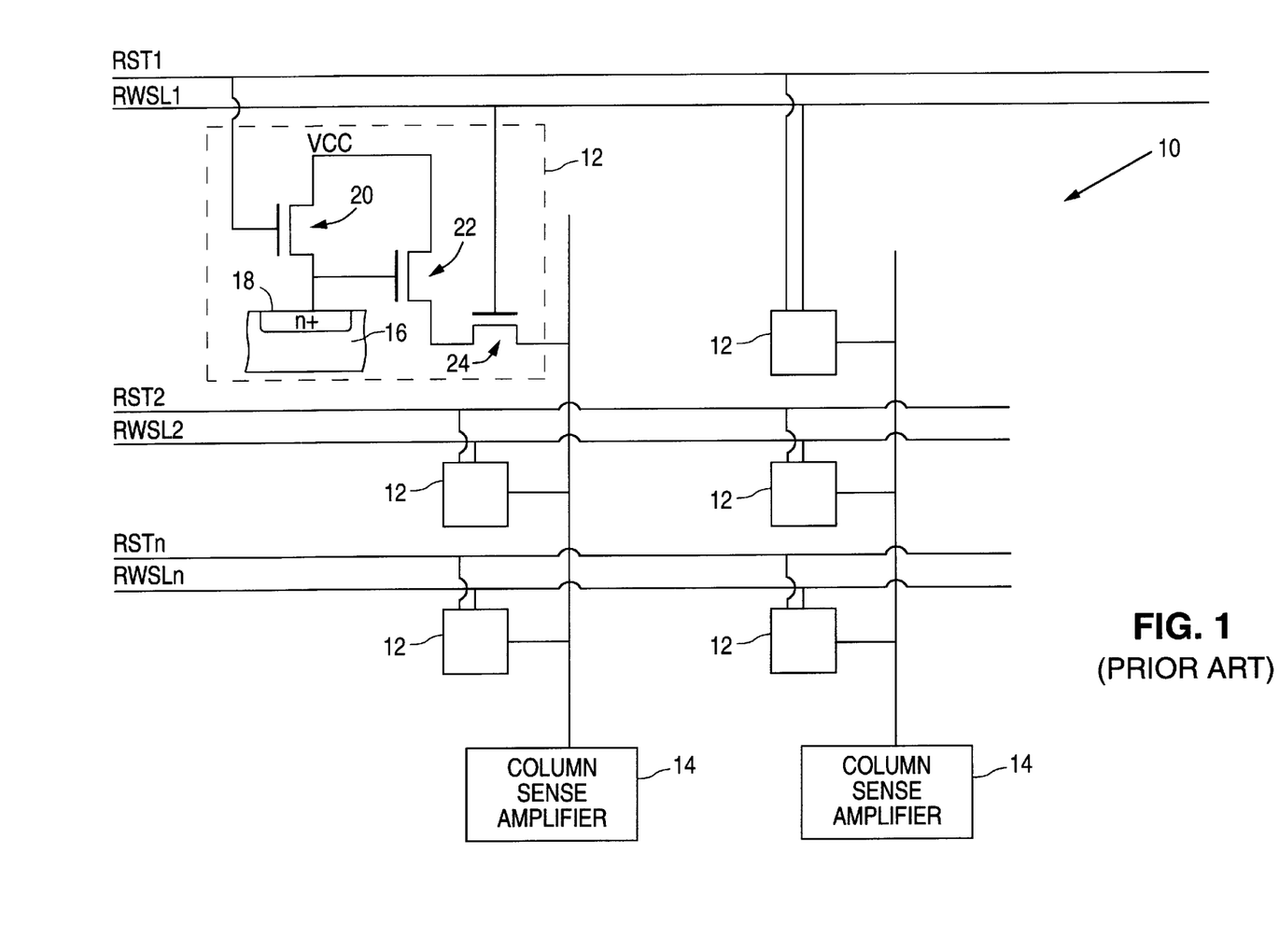
FIG. 1 is a cross-sectional and schematic diagram illustrating a portion of a conventional CMOS active pixel sensor cell array 10.

FIG. 1 shows a cross-sectional and schematic diagram that illustrates a portion of a conventional CMOS active pixel sensor cell array 10. As shown in FIG. 1, array 10 includes a plurality of active pixel sensor cells 12 which are formed in rows and columns, and a plurality of column sense amplifiers 14 which are connected to the cells 12 so that one amplifier 14 is connected to each cell 12 in a column of cells.

As further shown in FIG. 1, each cell 12, which is formed in a lightly-doped, e.g., $1 \times 10^{14}$ to $1 \times 10^{15}$ atoms/cm$^3$, p-type substrate 16 (or an epitaxial (epi) layer), includes a heavily-doped, e.g., $5 \times 10^{15}$ to $1 \times 10^{19}$ atoms/cm$^3$, n+ region 18 which is formed in substrate 16 (or the epi layer) to function as a photodiode, and a reset transistor 20 which has a source connected to n+ region 18 and a gate connected to receive one of a plurality of reset signals RST1–RSTn.

In addition, each cell 12 also includes a source-follower transistor 22 which has a gate connected to n+ region 18, and a row-select transistor 24 which has a drain connected to the source of source-follower transistor 22 and a gate connected to receive one of a plurality of row-select signals RWSL1–RWSLn.

In operation, array 10 first sequentially resets each row of cells in the array. During the reset step, the potential on n+ region 18 of each cell 12 in the first row of cells is raised to an initial transfer voltage by pulsing the gates of the reset transistors 20 in the first row with a positive voltage via the reset signal RST1. The initial transfer voltage placed on n+ region 18 of each cell 12, in turn, defines an initial intermediate voltage on the source of each of the source-follower transistors 22 in the first row.

Immediately after the gates of the reset transistors 20 have been pulsed, the gates of the row-select transistors 24 in the first row are pulsed with a positive voltage via the row-select signal RWSL1. The positive voltage on the gates of the row-select transistors 24 causes the initial intermediate voltages on the sources of the source-follower transistors 22 to appear on the sources of the row-select transistors 24 as initial integration voltages.

The initial integration voltage of each cell 12 in the first row is sensed and amplified by the column sense amplifier 14 that corresponds with each cell 12 in the row, and then stored by an imaging system (not shown). The same process is then repeated on the remaining rows in the array.

Following reset, light energy, in the form of photons, penetrates into n+ region 18, and substrate 16 (or the epi layer) of each cell 12, thereby creating a number of electron-hole pairs in each cell 12. The photogenerated holes which are formed in n+ region 18 of a cell 12 which diffuse over to the junction region are attracted to substrate 16 (or the epi layer) of the cell 12 under the influence of the junction electric field, while the photogenerated holes formed in substrate 16 (or the epi layer) of the cell 12 remain in substrate 16 (or the epi layer).

Similarly, the photogenerated electrons formed in substrate 16 (or the epi layer) of the cell 12 which diffuse over to the junction region are attracted to n+ region 18 of the cell 12 under the influence of the junction electric field, while the photogenerated electrons formed in n+ region 18 of the cell 12 remain in n+ region 18 where each additional electron reduces the potential on n+ region 18 of the cell 12.

Thus, at the end of an integration period, the potential on n+ region 18 of each cell 12 in the first row will have been reduced to a final transfer voltage where the amount of the reduction represents the intensity of the received light energy.

Following this, the final transfer voltage on n+ region 18 of each cell 12 in the first row is then read out via the source-follower transistors 22 of each cell 12 as a final integration voltage by again pulsing the gates of the row-select transistors 24 in the first row. As a result, the total charge collected by each cell 12 in the first row is determined by subtracting the final integration voltage of the cell from the initial integration voltage of the cell.

Figure 2:
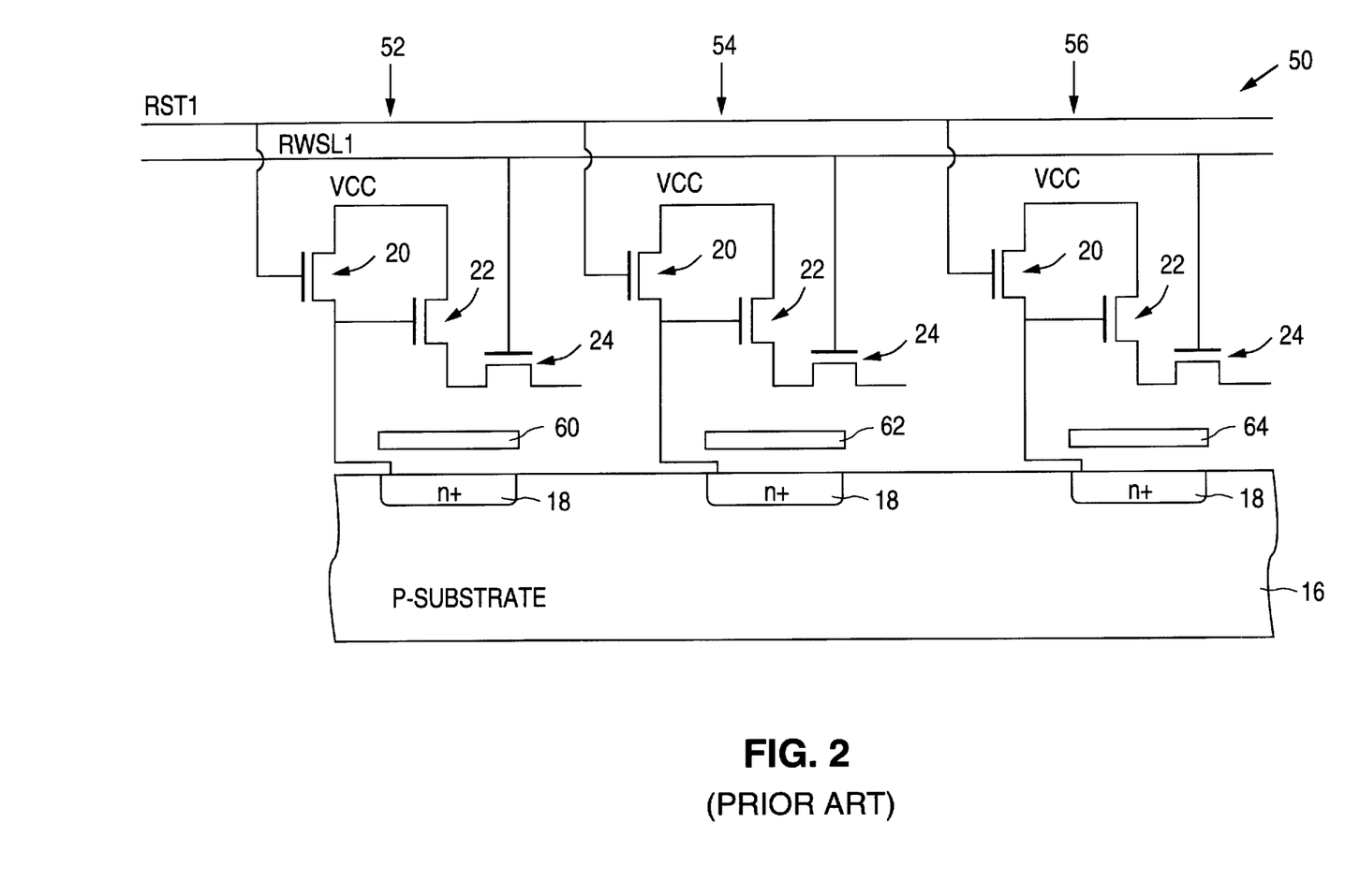
FIG. 2 is a cross-sectional and schematic diagram illustrating a conventional color pixel 50.

With black-and-white imaging, each cell 12 represents a pixel of light energy. However, with color imaging, three cells 12 are required to form a single color pixel. FIG. 2 shows a cross-sectional and schematic diagram that illustrates a conventional color pixel 50.

As shown in FIG. 2, color pixel 50, which uses the same reference numerals to designate the structures which are common to both FIGS. 1 and 2, includes a red active pixel sensor cell 52, a green active pixel sensor cell 54, and a blue active pixel sensor cell 56.

As further shown in FIG. 2, red cell 52 only differs from cells 12 of FIG. 1 in that red cell 52 includes a red filter 60 which only passes red photons. Similarly, green and blue cells 54 and 56 only differ from cells 12 in that green and blue cells 54 and 56 include green and blue filters 62 and 64, respectively, which only pass green and blue photons.

Thus, cells 52, 54, and 56 operate the same as cells 12 of FIG. 1 except that the information provided by red, green, and blue cells 52, 54, and 56 is limited to the intensities of the red, green, and blue lights, respectively.

One of the difficulties with the use of color pixel 50, however, is that the minority carriers formed in blue cell 56 are substantially more likely to be lost to recombination than the minority carriers formed in red and green cells 52 and 54.

This difference in recombination rates is due to the relatively shallow penetration depths of the blue photons, the higher majority carrier concentration that exists in n+ region 18 than exists in substrate 16 (or the epi layer), and the depth of the junction.

Figure 3A:
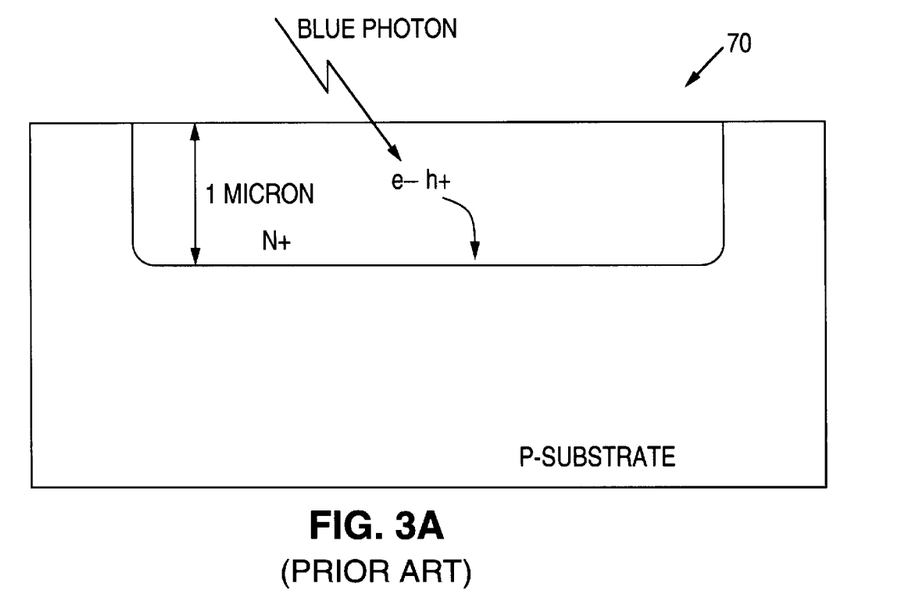
FIG. 3A is a cross-sectional diagram illustrating a conventional n+/p– CCD photodiode 70.
Figure 3B:
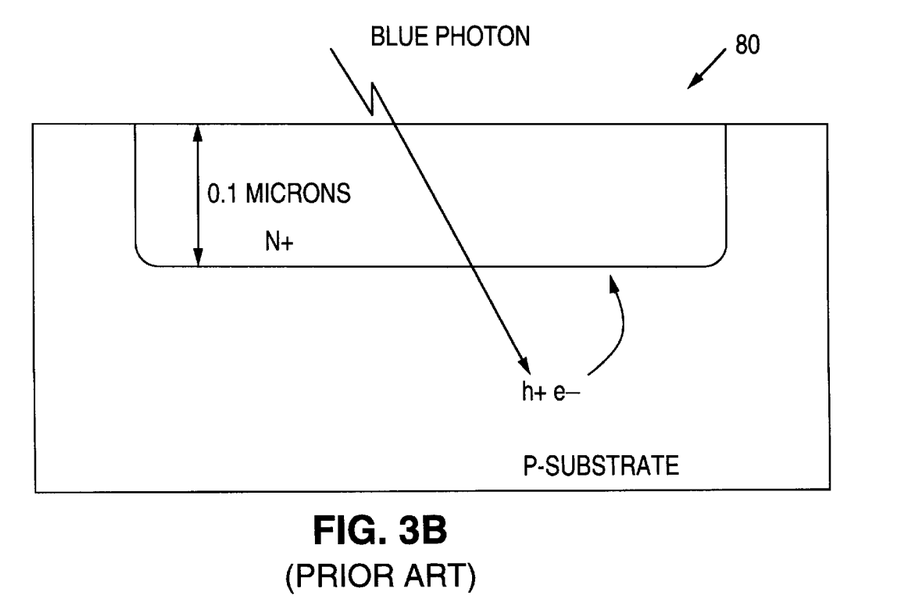
FIG. 3B is a cross-sectional diagram illustrating a conventional n+/p– CMOS photodiode 80.

FIG. 3A shows a cross-sectional diagram that illustrates a conventional n+/p− CCD photodiode 70, while FIG. 3B shows a conventional n+/p− CMOS photodiode 80. As shown in FIGS. 3A and 3B, the typical junction depth of a CCD photodiode is approximately one micron, while the typical junction depth of a CMOS photodiode based on a 0.25 micron photolithographic process is approximately 0.1 microns. In addition, blue photons typically penetrate about 0.2 microns into the photodiode before interacting with the lattice to form electron-hole pairs (EHPs).

In the case of CCD photodiodes, the average penetration depth of the blue photons means that the majority of the EHPs are formed in the n+ region, whereas with CMOS photodiodes the majority of blue EHPs are formed in the substrate.

As noted above, the photogenerated electrons formed in the n+ region remain in the n+ region, while the photogenerated holes formed in the n+ region diffuse over to the junction where the holes are swept into the substrate under the influence of the junction electric field. However, with the high concentration of majority carriers in the n+ region, a high percentage of the holes in the CCD photodiode are lost to recombination in the n+ region before being collected by the substrate.

As also noted above, the photogenerated holes formed in the substrate remain in the substrate, while the photogenerated electrons formed in the substrate diffuse over to the junction where the electrons are swept into the n+ region under the influence of the junction electric field.

However, since the majority carrier concentration in the substrate is much lower than the majority carrier concentration in the n+ region, far fewer photogenerated electrons are lost to recombination when diffusing to the n+ region in the CMOS photodiode than photogenerated holes are lost when diffusing to the substrate in the CCD photodiode. Thus, CMOS photodiodes provide a substantially better blue response than CCD photodiodes.

However, even though CMOS photodiodes provide a substantially better blue response than CCD photodiodes, the blue response of a CMOS photodiode remains substantially below the red and green responses of a CMOS photodiode. The poor blue response of CMOS photodiodes exists because, even though the average penetration depth of a blue photon is approximately 0.2 microns, a large number of the blue photons fail to penetrate beyond the 0.1 micron junction. As a result, a large number of these photons are still lost to recombination.

On the other hand, the average penetration depth of red and green photons is on the order of several microns. At this depth, the EHPs formed from the red and green photons are almost exclusively formed in the substrate rather than the n+ region.

Thus, whereas a significant number of blue photons continue to form EHPs in the n+ region, virtually none of the red and green photons form EHPs in the n+ region. As a result, far fewer of the holes formed from red and green photons are lost to recombination in the n+ region. Thus, the blue response in a CMOS photodiode is substantially lower than the red and green responses.

One technique for equalizing the red, green, and blue responses is to increase the amplification provided by the column sense amplifiers 14 that correspond with the blue cells 56. For example, if the blue response is 10× lower than the red and green responses, equalized red, green, and blue responses are obtained if the column sense amplifiers 14 that correspond with the red and green cells 52 and 54 are set to provide unity gain, and the column sense amplifiers 14 that correspond with the blue cells 56 are set to provide a gain of 10×.

One problem with increasing the amplification provided by the column sense amplifiers 14, however, is that noise is introduced by the charge-to-voltage conversion process (which varies from cell to cell) as well as by the sense amplifiers themselves. As a result, the noise is gained up by 10× along with the blue signal which, in turn, reduces the signal-to-noise ratio of the blue signal accordingly.

Thus, there is a need for a color pixel that increases the blue response with respect to the red and green responses while minimizing the amplification required by the column sense amplifiers.

SUMMARY OF THE INVENTION

Conventional CMOS-based color pixels suffer from a blue signal that is substantially noisier than the red and green signals. The increased noise results from the substantial amplification of the blue signal which is required to balance the much smaller blue signal with the larger red and green signals. The substantial amplification of the blue signal, in turn, also amplifies the noise associated with the blue signal.

The small blue signal results from the inability of blue photons to penetrate beyond the heavily-doped surface region of a pn-junction photodiode. As a result of this shallow penetration, the minority carriers that are formed from the blue photons experience a significantly higher recombination rate than the minority carriers formed from red and green photons.

The present invention increases the magnitude of the blue response by lowering the doping concentration of the surface region of the pn-junction photodiode used to collect blue photons with respect to the surface regions of the pn-junction photodiodes that are used to collect red and green photons.

By lowering the doping concentration, the charge representing the blue photons is increased prior to the noisy step of converting the charge into a voltage. Even modest increases in the charge at this stage can significantly reduce the noise associated with the amplified blue signal.

A color pixel in accordance with the present invention, which is formed in a substrate of a first conductivity type, includes first, second, and third regions of a second conductivity type which are each formed in the substrate. The doping concentrations of the first and second regions are substantially equal. However, the doping concentration of the third region is substantially less than the doping concentration of the first region.

In addition, the color pixel also includes first, second, and third reset transistors which each have a source where the source of the first reset transistor is connected to the first region, the source of the second transistor is connected to the second region, and the source of the third transistor is connected to the third region.

A better understanding of the features and advantages of the present invention will be obtained by reference to the following detailed description and accompanying drawings which set forth an illustrative embodiment in which the principles of the invention are utilized.

DETAILED DESCRIPTION

Figure 4:
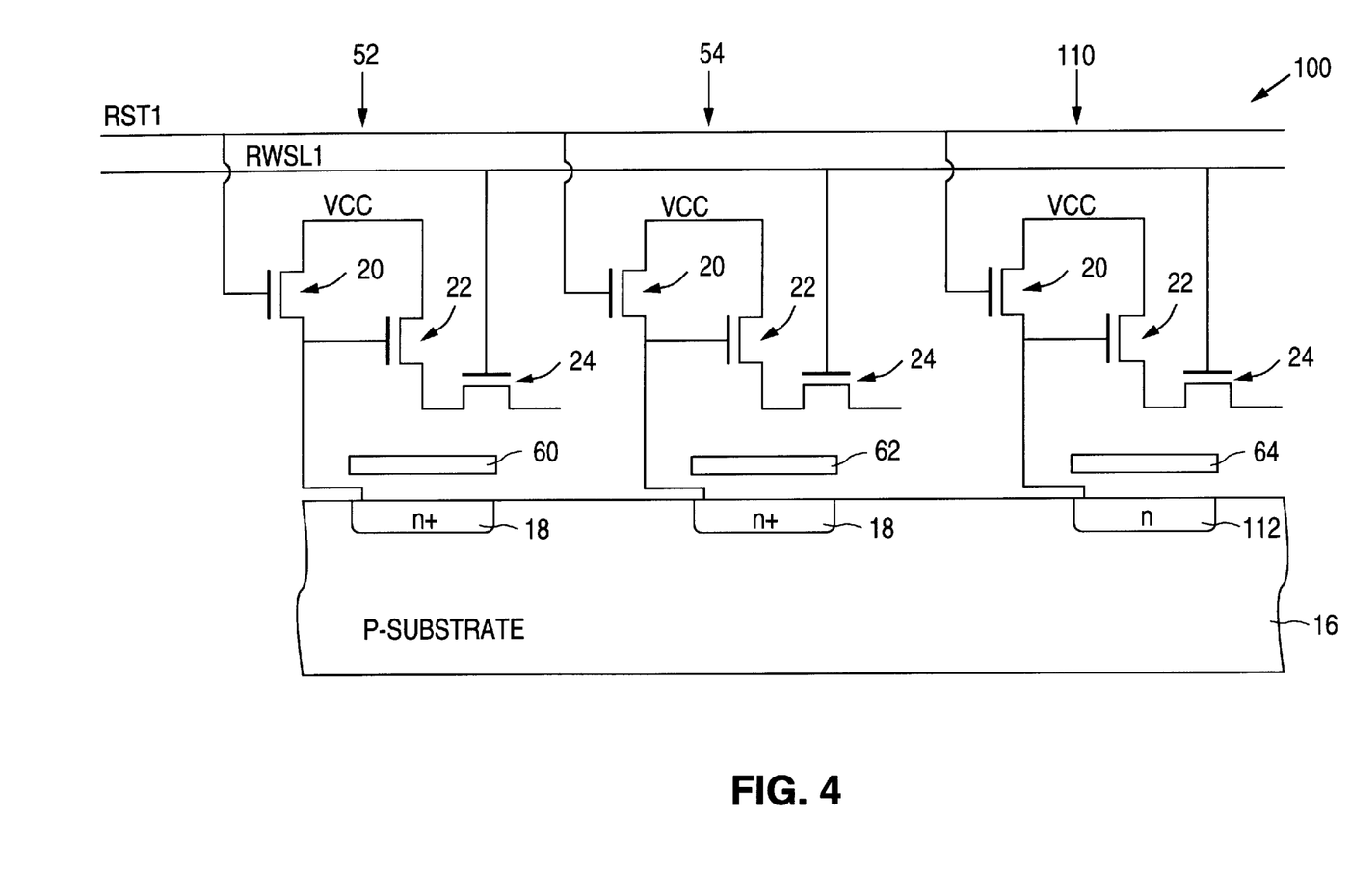
FIG. 4 is a cross-sectional and schematic diagram illustrating a color pixel 100 in accordance with the present invention.

FIG. 4 shows a cross-sectional and schematic diagram that illustrates a color pixel 100 in accordance with the present invention. As described in greater detail below, color pixel 100 increases the blue response with respect to the red and green responses by lowering the doping concentration of the n-type regions used to form the photodiodes of the blue cells with respect to the n-type regions used to form the photodiodes of the red and green cells.

As shown in FIG. 4, pixel 100, which uses the same reference numerals to designate the structures which are common to both FIGS. 2 and 4, includes a red active pixel sensor cell 52, a green active pixel sensor cell 54, and a blue active pixel sensor cell 110.

In accordance with the present invention, blue cell 110 of FIG. 4 differs from blue cell 56 of FIG. 2 in that blue cell 110 utilizes a moderately-doped, e.g., approximately $5 \times 10^{14}$ to $1 \times 10^{17}$ atoms/cm$^3$, n-type region 112 to form a photodiode in lightly-doped, e.g., $1 \times 10^{14}$ to $1 \times 10^{15}$ atoms/cm$^3$, substrate 16 (or the epi layer) in lieu of the heavily-doped, e.g., approximately $5 \times 10^{15}$ to $1 \times 10^{19}$ atoms/cm$^3$, n+ region 18 utilized by blue cell 56.

In operation, cells 52 and 54 of FIG. 4 operate the same as cells 52 and 54 of FIG. 2. Cell 110, on the other hand, operates differently from cell 56 in that by utilizing a lower doping concentration in region 112 than is used in region 18, fewer holes are lost to recombination in region 112 of cell 110 than are lost in region 18 of cell 56 since fewer majority carriers are present in region 112 to participate in recombination. Since fewer holes are lost to recombination, region 112 is able to collect more electrons than region 18.

Thus, when cells 56 and 110 are both exposed to the same light source for an equivalent period of time which is insufficient to saturate either of the cells 56 or 110, the negative charge collected by region 112 is greater than the negative charge collected by region 18.

In addition, by utilizing moderately-doped n-type region 112 instead of heavily-doped n+ region 18, the junction capacitance of cell 110 is less than the junction capacitance of cell 56. Further, the voltages obtained from regions 18 and 112 are a function of the junction capacitances, i.e., C=dQ/dV. As a result, when cells 56 and 110 both contain the same photocharge, the higher junction capacitance of cell 56 converts the photocharge to a voltage which is lower than the voltage obtained from converting the photocharge on cell 110 to a voltage.

Thus, by lowering the doping concentration of n-type region 112 of cell 110 with respect to n+ region 18 of cell 56, cell 110 collects more photogenerated electrons than cell 56, and provides a higher charge-to-voltage conversion ratio than cell 56. As a result, the voltage sensed from moderately-doped n-type region 112 of cell 110 will be greater than the voltage sensed from n+ region 18 of cell 56.

Thus, pixel 100 of the present invention reduces the differences between the red, green, and blue responses before the noisy charge-to-voltage conversion stage. As a result, less amplification is needed by the column sense amplifiers to balance the red, green, and blue responses which, in turn, reduces the amplification of the noise associated with the blue signal.

Further, even modest increases in the gain of the blue response that occur before the charge-to-voltage conversion stage provide significant reductions in the level of noise. For example, if the voltage sensed from moderately-doped n-type region 112 of cell 110 is only twice as large as the voltage sensed from n+ region 18 of cell 56, then the amplification required by the blue-cell column sense amplifiers to equalize the red, green, and blue responses can be reduced from approximately 10× to 5×.

Figure 5:
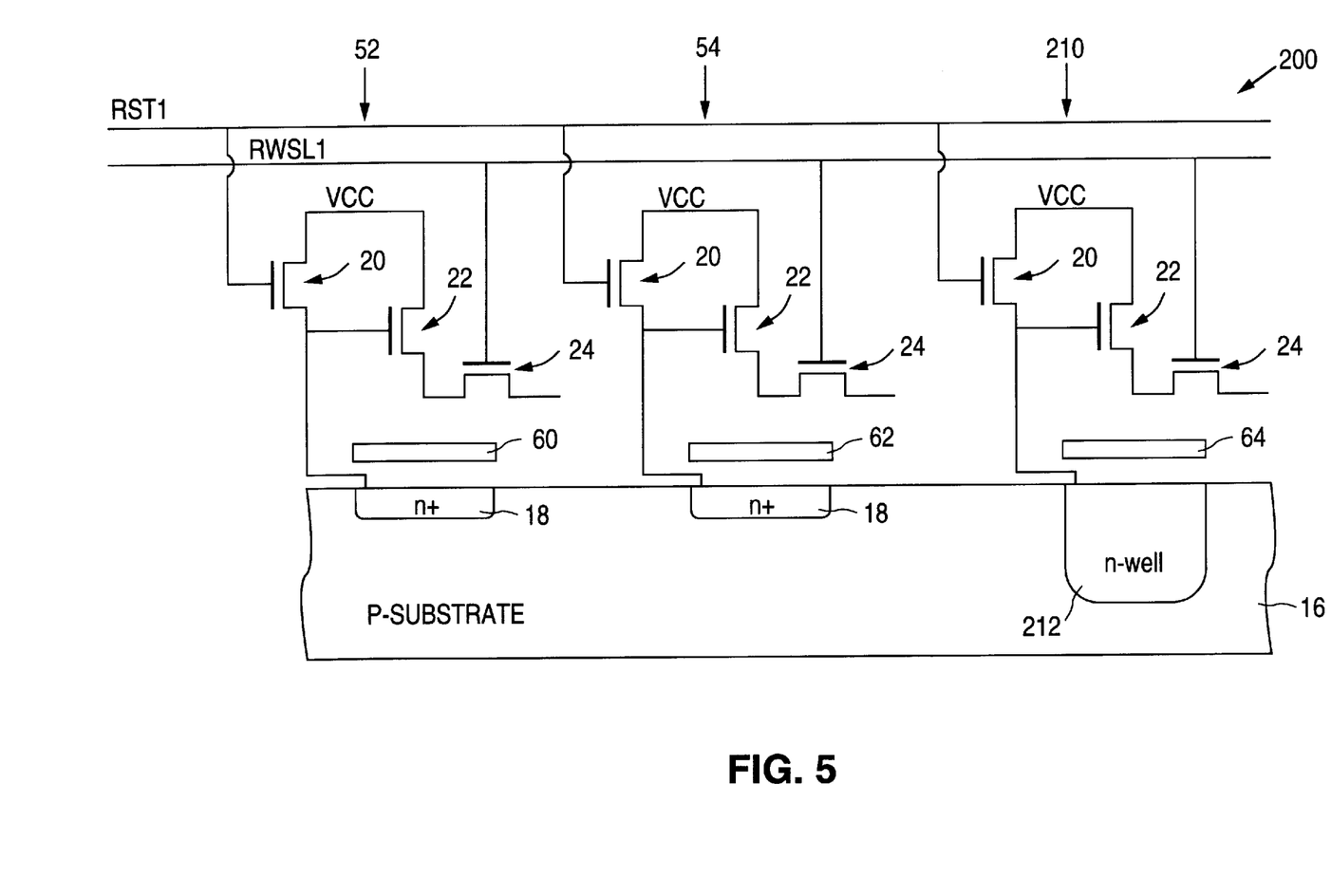
FIG. 5 is a cross-sectional and schematic diagram illustrating a color pixel 200 in accordance with a first alternate embodiment of the present invention.

FIG. 5 shows a cross-sectional and schematic diagram that illustrates a color pixel 200 in accordance with a first alternate embodiment of the present invention. As shown in FIG. 5, pixel 200, which uses the same reference numerals to designate the structures which are common to both FIGS. 4 and 5, includes a red active pixel sensor cell 52, a green active pixel sensor cell 54, and a blue active pixel sensor cell 210.

In accordance with the present invention, blue cell 210 of FIG. 5 differs from blue cell 110 of FIG. 4 in that blue cell 210 utilizes an n-well 212, which may be formed as a diffused or retrograde well, in lieu of n-type region 112.

In operation, pixel 200 operates the same as pixel 100 except that n-well 212, which has approximately the same doping concentration as n-type region 112, has a slightly higher recombination rate than n-type region 112 due to the greater depth of n-well 212 than n-type region 112.

The advantage provided by pixel 200, however, is that the formation of n-well 212 is transparent to conventional CMOS fabrication processes which already form n-wells as part of the process of forming PMOS transistors. Thus, pixel 200 reduces the noise associated with the blue response without increasing the time, cost, or complexity of the fabrication process.

Figure 6:
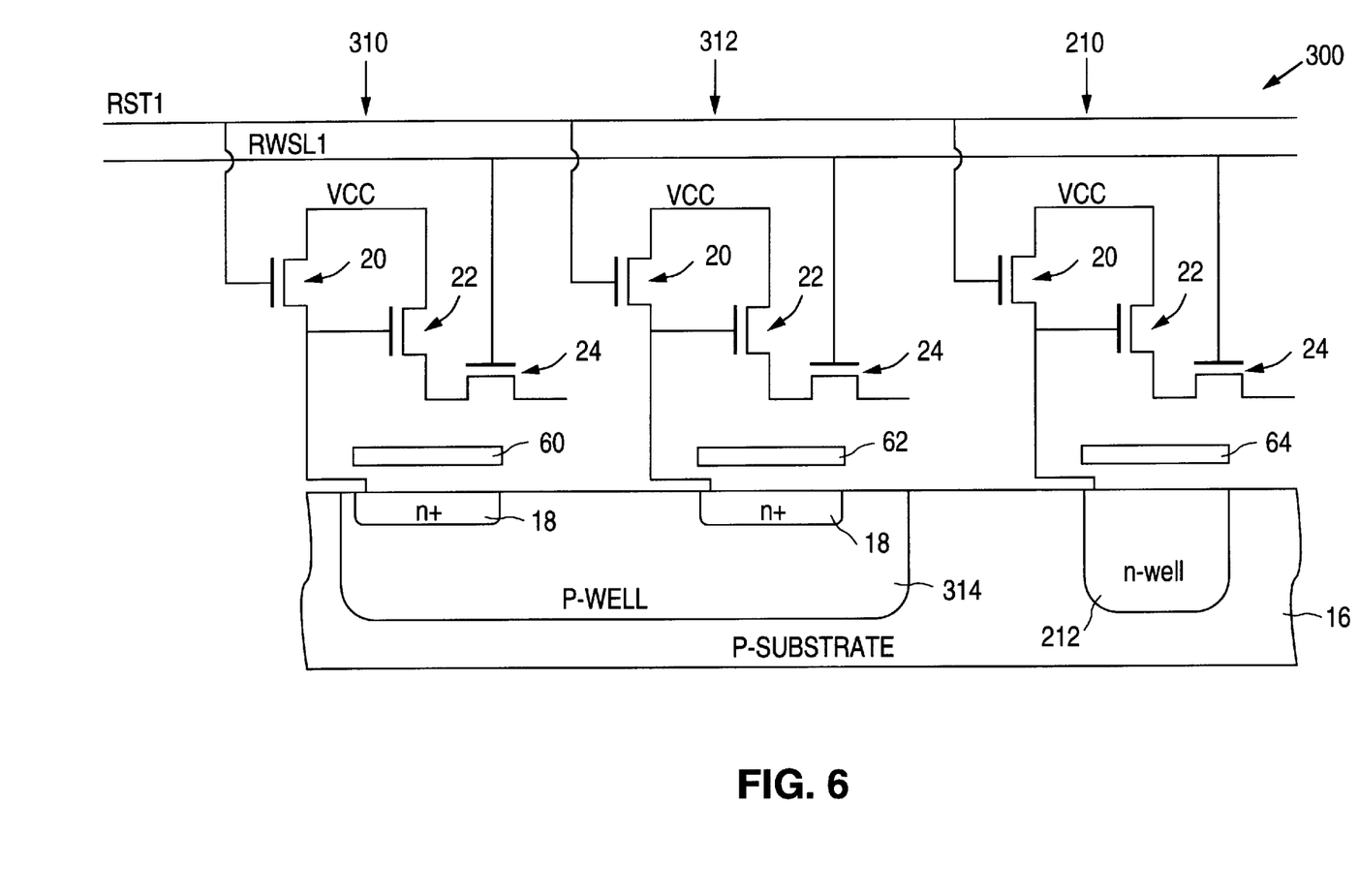
FIG. 6 is a cross-sectional and schematic diagram illustrating a color pixel 300 in accordance with a second alternate embodiment of the present invention.

In addition, the present invention applies equally well to twin-tub CMOS processes. FIG. 6 shows a cross-sectional and schematic diagram that illustrates a color pixel 300 in accordance with a second alternate embodiment of the present invention.

As shown in FIG. 6, pixel 300, which uses the same reference numerals to designate the structures which are common to both FIGS. 5 and 6, includes a red active pixel sensor cell 310, a green active pixel sensor cell 320, and a blue active pixel sensor cell 210.

In accordance with the present invention, red and green cells 310 and 312 of FIG. 6 differ from red and green cells 52 and 54 of FIG. 5 in that n+ region 18 of red and green cells 310 and 312 are formed in a p-well 314 having a doping concentration in the range of $5 \times 10^{14}$ to $1 \times 10^{17}$ atoms/cm$^3$ which, in turn, is formed in substrate 16 (or the epi layer).

In operation, pixel 300 operates the same as pixel 200 except that the red and green responses are slightly lower due to the increased junction capacitance that exists between n+ region 18 and p-well 314 of cell 300 as compared to the junction capacitance that exists between n+ region 18 and p-substrate 16 (or the epi layer).

Figure 7:
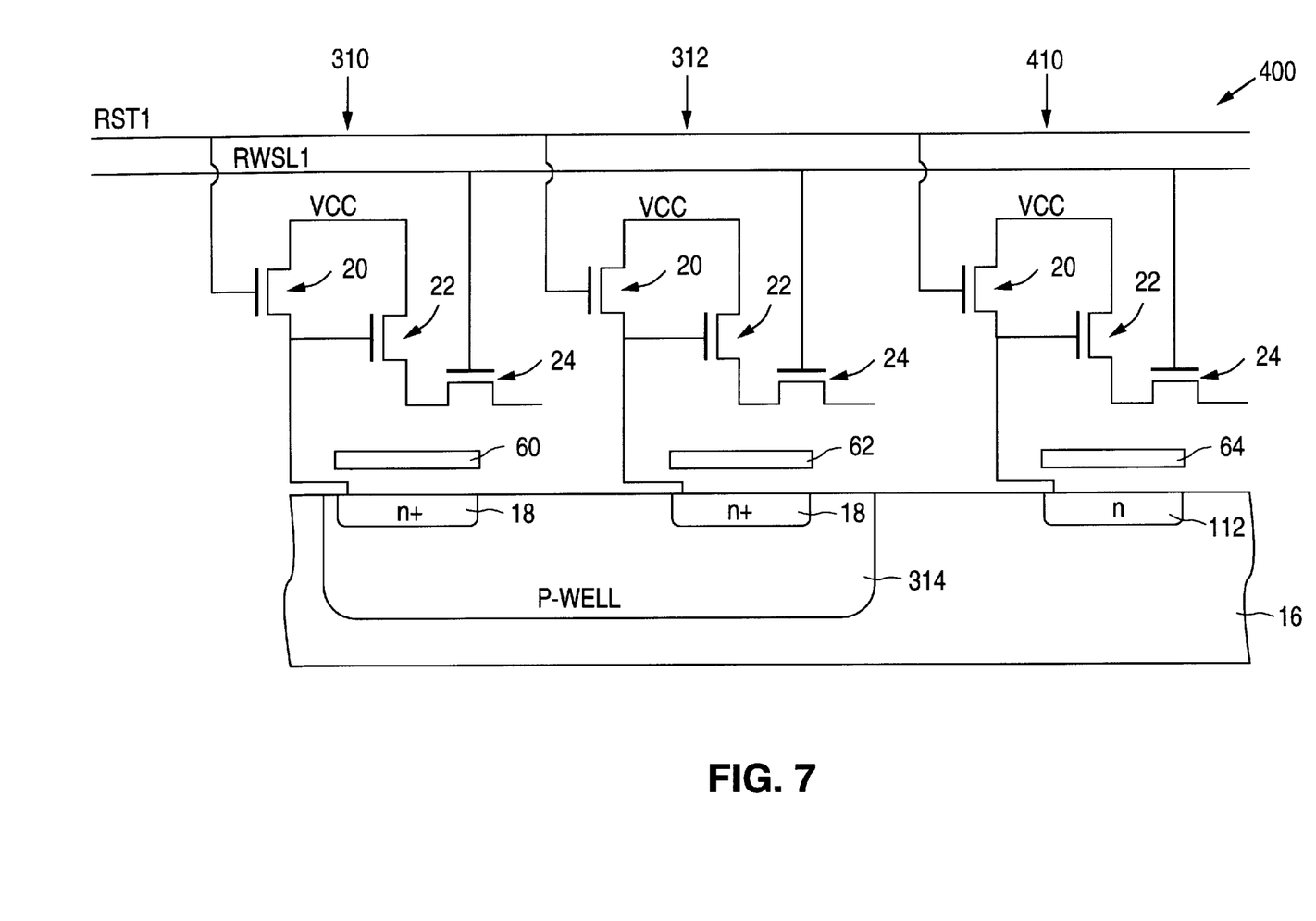
FIG. 7 is a cross-sectional and schematic diagram illustrating a color pixel 400 in accordance with a third alternate embodiment of the present invention.

FIG. 7 shows a cross-sectional and schematic diagram that illustrates a color pixel 400 in accordance with a third alternate embodiment of the present invention. As shown in FIG. 7, pixel 400, which uses the same reference numerals to designate the structures which are common to both FIGS. 6 and 7, includes a red active pixel sensor cell 310, a green active pixel sensor cell 320, and a blue active pixel sensor cell 410 which identical to blue cell 110 of FIG. 4.

Thus, in accordance with the present invention, a color pixel has been described that increases the blue response of the pixel prior to the noisy charge-to-voltage conversion stage.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A color pixel formed in a substrate of a first conductivity type, the pixel comprising:
   a first region of a second conductivity type formed in the substrate, the first region having a doping concentration;
   a second region of the second conductivity type formed in the substrate, the second region having a doping concentration, the doping concentration of the first region and the doping concentration of the second region being substantially equal;
   a third region of the second conductivity type formed in the substrate, the third region having a doping concentration, the doping concentration of the third region being substantially less than the doping concentration of the first region;
   a first reset transistor having a source connected to the first region,
   a second reset transistor having a source connected to the second region, and
   a third reset transistor having a source connected to the third region.

2. The color pixel of claim 1 and further including a first color filter formed over the first region, a second color filter formed over the second region, and a third color filter formed over the third region.

3. The color pixel of claim 1 and further comprising:
   a first source-follower transistor having a gate connected to the first region,
   a second reset transistor having a gate connected to the second region, and
   a third reset transistor having a gate connected to the third region.

4. The color pixel of claim 1 wherein the first region has a first depth, the second region has a second depth, and the third region has a third depth.

5. The color pixel of claim 4 wherein the first, second, and third depths are substantially equal.

6. The color pixel of claim 4 wherein the third depth is substantially greater than the first depth.

7. The color pixel of claim 4 wherein the third depth is substantially greater than the first and second depths.

8. A color pixel formed in a substrate of a first conductivity type, the pixel comprising:
   a first well of the first conductivity type formed in the substrate;
   a first region of a second conductivity type formed in the first well, the first region having a doping concentration;
   a second region of the second conductivity type formed in the first well, the second region having a doping concentration, the doping concentration of the first region and the doping concentration of the second region being substantially equal;
   a second well of the second conductivity type formed in the substrate, the second well having a doping concentration, the doping concentration of the second well being substantially less than the doping concentration of the first region;
   a first reset transistor having a source connected to the first region,
   a second reset transistor having a source connected to the second region, and
   a third reset transistor having a source connected to the second well.

9. The color pixel of claim 8 and further including a first color filter formed over the first region, a second color filter formed over the second region, and a third color filter formed over the second well.

10. The color pixel of claim 8 and further comprising:
    a first source-follower transistor having a gate connected to the first region,
    a second reset transistor having a gate connected to the second region, and
    a third reset transistor having a gate connected to the third region.

11. A color pixel formed in a substrate of a first conductivity type, the pixel comprising:
    a well of the first conductivity type formed in the substrate;
    a first region of a second conductivity type formed in the first well, the first region having a doping concentration;
    a second region of the second conductivity type formed in the first well, the second region having a doping concentration, the doping concentration of the first region and the doping concentration of the second region being substantially equal;
    a third region of the second conductivity type formed in the substrate, the third region having a doping concentration, the doping concentration of the third region being substantially less than the doping concentration of the first region;
    a first reset transistor having a source connected to the first region,
    a second reset transistor having a source connected to the second region, and
    a third reset transistor having a source connected to the second well.

12. The color pixel of claim 11 and further including a first color filter formed over the first region, a second color filter formed over the second region, and a third color filter formed over the third region.

13. The color pixel of claim 11 and further comprising:
    a first source-follower transistor having a gate connected to the first region,
    a second reset transistor having a gate connected to the second region, and a third reset transistor having a gate connected to the third region.

14. The color pixel of claim 11 wherein the first region has a first depth, the second region has a second depth, and the third region has a third depth, the first, second, and third depths being substantially equal.

15. A method for forming a color pixel in a substrate of a first conductivity type, the method comprising the steps of:

forming a first region of a second conductivity type in the substrate, the first region having a doping concentration;

forming a second region of the second conductivity type in the substrate, the second region having a doping concentration, the doping concentration of the first region and the doping concentration of the second region being substantially equal;

forming a third region of the second conductivity type in the substrate, the third region having a doping concentration, the doping concentration of the third region being substantially less than the doping concentration of the first region;

forming a first reset transistor having a source connected to the first region, forming a second reset transistor having a source connected to the second region, and forming a third reset transistor having a source connected to the third region.

16. The method of claim 15 and further including the steps of:

forming a first color filter over the first region;

forming a second color filter over the second region; and forming a third color filter over the third region.

17. A method for forming a color pixel in a substrate of a first conductivity type, the method comprising the steps of:

forming a first well of the first conductivity type in the substrate;

forming a first region of a second conductivity type in the first well, the first region having a doping concentration;

forming a second region of the second conductivity type in the first well, the second region having a doping concentration, the doping concentration of the first region and the doping concentration of the second region being substantially equal;

forming a second well of the second conductivity type in the substrate, the second well having a doping concentration, the doping concentration of the second well being substantially less than the doping concentration of the first region;

forming a first reset transistor having a source connected to the first region, forming a second reset transistor having a source connected to the second region, and forming a third reset transistor having a source connected to the second well.

18. The method of claim 16 and further including the steps of:

forming a first color filter over the first region;

forming a second color filter over the second region; and forming a third color filter over the second well.

19. A method for forming a color pixel in a substrate of a first conductivity type, the method comprising the steps of:

forming a well of the first conductivity type in the substrate;

forming a first region of a second conductivity type in the first well, the first region having a doping concentration;

forming a second region of the second conductivity type in the first well, the second region having a doping concentration, the doping concentration of the first region and the doping concentration of the second region being substantially equal;

forming a third region of the second conductivity type in the substrate, the third region having a doping concentration, the doping concentration of the third region being substantially less than the doping concentration of the first region;

forming a first reset transistor having a source connected to the first region, forming a second reset transistor having a source connected to the second region, and forming a third reset transistor having a source connected to the second well.

20. The method of claim 19 and further including the steps of:

forming a first color filter over the first region;

forming a second color filter over the second region; and forming a third color filter over the third region.

* * * * *